US012237233B2

(12) United States Patent
Chou et al.

(10) Patent No.: US 12,237,233 B2
(45) Date of Patent: Feb. 25, 2025

(54) BACKSIDE POWER RAIL FOR PHYSICAL FAILURE ANALYSIS (PFA)

(71) Applicant: Taiwan Semiconductor Manufacturing Co., Ltd., Hsinchu (TW)

(72) Inventors: Chih-Chao Chou, Hsinchu (TW); Yi-Hsun Chiu, Hsinchu (TW); Shang-Wen Chang, Hsinchu (TW); Ching-Wei Tsai, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 473 days.

(21) Appl. No.: 17/738,928

(22) Filed: May 6, 2022

(65) Prior Publication Data

US 2023/0009640 A1    Jan. 12, 2023

Related U.S. Application Data

(60) Provisional application No. 63/218,813, filed on Jul. 6, 2021.

(51) Int. Cl.
| | |
|---|---|
| *H01L 21/66* | (2006.01) |
| *G01R 31/3183* | (2006.01) |
| *H01L 23/522* | (2006.01) |
| *H01L 23/528* | (2006.01) |

(52) U.S. Cl.
CPC ...... *H01L 22/12* (2013.01); *G01R 31/318342* (2013.01); *H01L 23/5226* (2013.01); *H01L 23/5283* (2013.01); *H01L 23/5286* (2013.01)

(58) Field of Classification Search
None
See application file for complete search history.

(56) References Cited

U.S. PATENT DOCUMENTS

| | | | |
|---|---|---|---|
| 2019/0295940 A1 | 9/2019 | Liaw | |
| 2022/0139863 A1* | 5/2022 | Song | H01L 23/5286 257/401 |

FOREIGN PATENT DOCUMENTS

| | | |
|---|---|---|
| CN | 109599400 A | 4/2019 |
| JP | 2013201158 A | 10/2013 |
| WO | WO 2011096055 A1 | 8/2011 |

* cited by examiner

*Primary Examiner* — Hsien Ming Lee
(74) *Attorney, Agent, or Firm* — Seed IP Law Group

(57) ABSTRACT

Semiconductor devices and methods are provided which facilitate performing physical failure analysis (PFA) testing from a backside of the devices. In at least one example, a device is provided that includes a semiconductor device layer including a plurality of diffusion regions. A first interconnection structure is disposed on a first side of the semiconductor device layer, and the first interconnection structure includes at least one electrical contact. A second interconnection structure is disposed on a second side of the semiconductor device layer, and the second interconnection structure includes a plurality of backside power rails. Each of the backside power rails at least partially overlaps a respective diffusion region of the plurality of diffusion regions and defines openings which expose portions of the respective diffusion region at the second side of the semiconductor device layer.

20 Claims, 14 Drawing Sheets

BACKSIDE POWER RAIL FOR PHYSICAL FAILURE ANALYSIS (PFA)

BACKGROUND

In semiconductor device manufacturing, semiconductor devices or dies on a semiconductor wafer may be tested, for example, by physical failure analysis (PFA), to determine causes of certain defects that may exist in the dies. Defects may be related to many causes, including for example, flaws in the design of the die as well as flaws in the manufacturing processes used to manufacture the die.

Physical failure analysis (PFA) typically entails probing the die with a wafer testing apparatus. By applying known electric test vectors and tracing the test vectors through the circuitry in the die, failure regions can be identified. A PFA test tool may include a radiation source that irradiates the die from a front side of the die in order to observe potential defects or failure regions in the die. Once a failure region is identified, additional steps such as manual net tracing are performed to determine a layer in which the failures occur.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
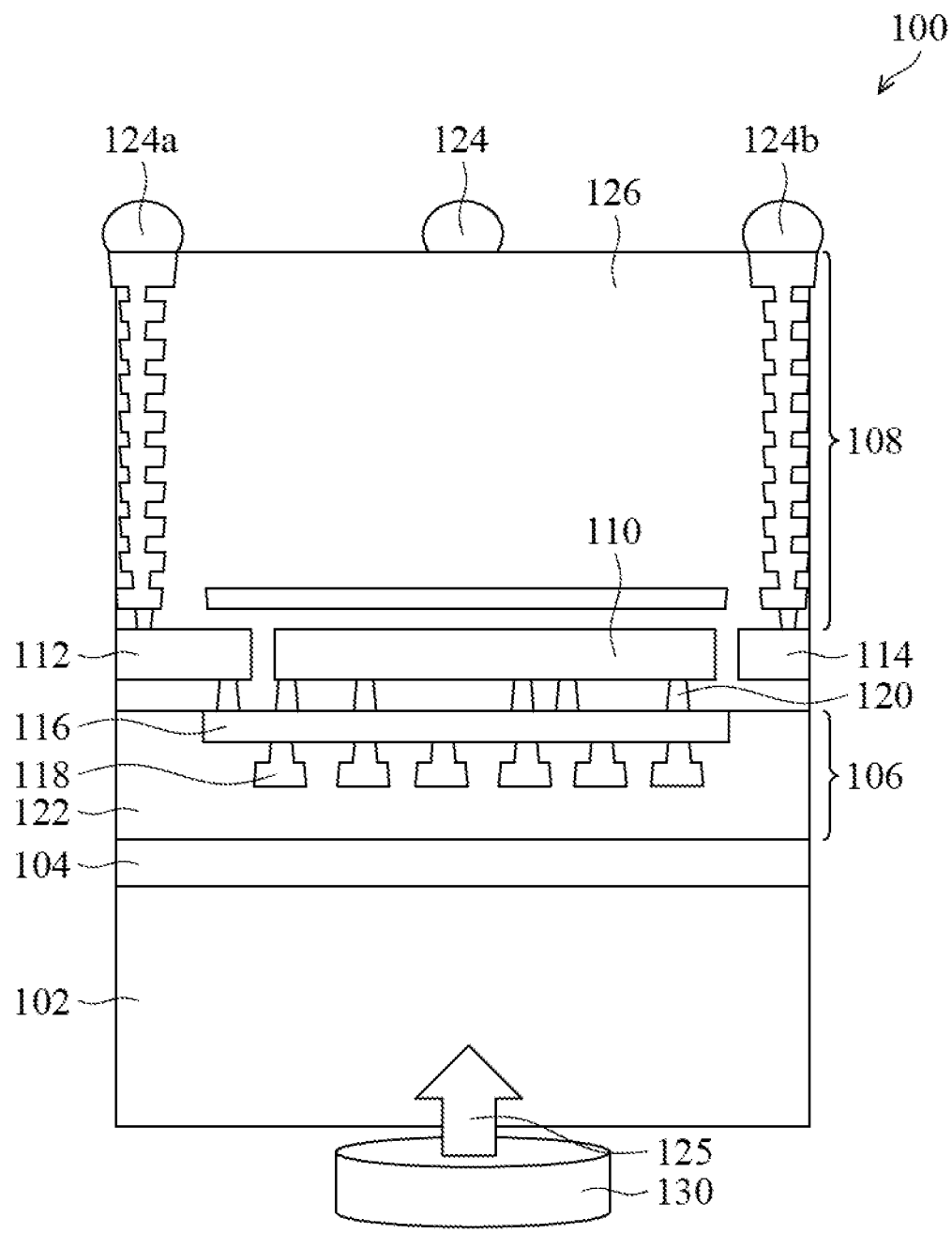
FIG. 1A is a cross-sectional diagram illustrating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein include devices and methods which facilitate performing physical failure analysis (PFA) testing from a backside of the devices. The devices include a semiconductor device layer that is at least partially exposed from a backside of the device through openings formed in the power rails. This allows PFA to be performed from the backside without irradiation from the PFA tester being blocked by the power rails, as in conventional methods. Instead, the irradiation can reach the exposed portions of the semiconductor device layer through the openings. This results in improved global fault isolation or PFA testing of the device, which results in yield improvement of the devices since they can be tested more effectively and efficiently from the backside of the device, and because front side power rail placement may reduce routing resources at the front side of the device. As such, by placing the power rails at the backside of the device, additional area is available for signal routing at the front side.

Moreover, moving the power rail layout to the backside of the devices (as opposed to the front side) is advantageous particularly as devices have smaller and smaller features sizes, as the power rail layout facilitates a denser placement of semiconductor devices (e.g., transistors) while further allowing effective PFA testing of the devices without blockage by overlying power rails.

Additionally, due to the presence of the openings in the power rails in some embodiments of the present disclosure, a maximum width of the power rails may be increased as compared to conventional power rails. This results in the power rails of the present disclosure having a lower resistance than conventional power rails.

FIG. 1A is a cross-sectional diagram illustrating a semiconductor device 100, in accordance with some embodiments of the present disclosure. The semiconductor device 100 may be any semiconductor device, such as, but not limited to, a logic device, a memory device, or any other semiconductor device. In some embodiments, the semiconductor device 100 is a logic device, or a static random access memory (SRAM) device formed of logic transistor. As shown in FIG. 1A, the device 100 includes a substrate 102, a bonding layer 104, a backside interconnection structure 106, and a front side interconnection structure 108.

The substrate 102 may be any suitable substrate. In some embodiments, the substrate 102 may be a semiconductor wafer. In some embodiments, the substrate 102 may be a monocrystalline silicon (Si) wafer, an amorphous Si wafer, a gallium arsenide (GaAs) wafer, or any other semiconductor wafer. In some embodiments, the substrate 102 may be a carrier wafer, which may be substantially free of electrical features and may be utilized to bond to the device 100 (e.g., bonded to the backside interconnection structure 106) during processing of the device 100, such as during physical failure analysis (PFA) testing.

The device 100 further includes a semiconductor device layer 110. The semiconductor device layer 110 includes a plurality of semiconductor devices. The semiconductor devices included within the semiconductor device layer 110 may be any semiconductor devices in various embodiments. In some embodiments, the semiconductor device layer 110 includes one or more transistors, which may include any suitable transistor structures, including, for example, Fin-FET, gate-all-around (GAA) transistors, or the like. In some embodiments, the semiconductor device layer 110 includes one or more GAA transistors. In some embodiments, the semiconductor device layer 110 may be a logic layer that includes one or more semiconductor devices, and may further include their interconnection structures, that are configured and arranged to provide a logical function, such as AND, OR, XOR, XNOR, or NOT, or a storage function, such as a flipflop or a latch.

In some embodiments, the semiconductor device layer 110 may include a memory device, which may be any suitable memory device, such as, for example, a static random access memory (SRAM) device. The memory device may include a plurality of memory cells that are constructed in rows and columns, although other embodiments are not limited to this arrangement. Each memory cell may include multiple transistors (e.g., six) connected between a first voltage source (e.g., VDD) and a second voltage source (e.g., VSS or ground) such that one of two storage nodes can be occupied by the information to be stored, with the complementary information stored at the other storage node.

The device 100 includes power management circuitry 112 (which may be referred to herein as "header circuitry 112") that is electrically coupled to the semiconductor device layer 110. The header circuitry 112 may include any suitable circuitry for controlling or otherwise managing communication signals, such as input power signals, to or from the semiconductor device layer 110. In some embodiments, the header circuitry 112 may include power-gating circuitry which may reduce power consumption, for example, by shutting off the current to blocks of the circuit (e.g., blocks or electrical features in the semiconductor device layer 110) that are not in use, thereby reducing stand-by or leakage power. In some embodiments, the header circuitry 112 includes switching devices, such as a plurality of transistors, that are used to transmit or receive electrical signals to and from the semiconductor device layer 110, such as to turn on and turn off the circuitry (e.g., transistors, etc.) of the semiconductor device layer 110.

The header circuitry 112 may be disposed laterally adjacent to a first side of the semiconductor device layer 110, as shown in FIG. 1A. An input/output layer 114 may be disposed laterally adjacent to a second side of the semiconductor device layer 110, that is opposite the first side. For example, as shown in FIG. 1A, the header circuitry 112 may be disposed adjacent to the left side of the semiconductor device layer 110, while the input/output layer 114 may be disposed adjacent to the right side of the semiconductor device layer 110. In some embodiments, the input/output layer 114 may be electrically coupled to the semiconductor device layer 110. The input/output layer 114 may include any circuitry suitable for receiving or transmitting input or output signals to or from the semiconductor device layer 110.

The backside interconnection structure 106 is disposed at a backside of the semiconductor device layer 110, e.g., at the lower side as shown in FIG. 1A. The backside interconnection structure 106 may include any suitable electrical interconnection structures, circuitry, wiring, or the like suitable to receive or transmit electrical signals to and from the semiconductor device layer 110.

In some embodiments, the backside interconnection structure 106 includes a backside power rail 116 that is disposed between a backside power delivery network 118 and a plurality of backside vias 120.

The backside power rail 116 may include a plurality of conductive lines or power rails which operably deliver or receive electrical signals (e.g., power or voltage signals) to or from the semiconductor devices in the semiconductor device layer 110. The backside power rail 116 may be formed of any suitable conductive material. In some embodiments, the backside power rail 116 is formed of or includes a metal.

The backside vias 120 are disposed and extend between the backside power rail 116 and the semiconductor device layer 110 and electrically couple the backside power rail 116 to the semiconductor device layer 110. The backside vias 120 may be any suitable conductive vias, and in some embodiments, the backside vias 120 are metal vias.

The backside power delivery network 118 is disposed between the backside power rail 116 and the substrate 102, e.g., at a backside of the backside power rail 116. The backside power delivery network 118 may include a plurality of conductive lines which may be utilized to selectively deliver or receive electrical signals (e.g., power or voltage signals) to or from the backside power rails 116 and/or the semiconductor device layer 110 in various embodiments. The backside power delivery network 118 may be formed of any suitable conductive material. In some embodiments, the backside power delivery network 118 is formed of or includes a metal material.

The backside interconnection structure 106 may further include an insulation layer 122 covering the backside power rail 116, the backside power delivery network 118, and the backside vias 120. The insulation layer 122 may be formed of any suitable insulation material, and in some embodiments, the insulation layer 122 electrically insulates or isolates the various electrical features within the backside interconnection structure 106 from one another. In some embodiments, the insulation layer 122 may be formed of a dielectric material, which may include one or more of silicon dioxide ($SiO_2$), SiON, SiOC and SiOCN or any other suitable insulating material. The insulation layer 122 may be disposed on and in contact with the bonding layer 104.

The bonding layer 104 bonds the substrate 102 to the backside interconnection structure 106. The bonding layer 104 may be formed of any material to suitably bond the backside interconnection structure 106 and the substrate 102. In some embodiments, the bonding layer 104 includes an oxide layer, such as silicon dioxide. However, embodiments provided herein are not limited thereto, and any other suitable material for the bonding layer 104 may be utilized in various embodiments. In some embodiments, the bonding layer 104 is formed by a thermal oxidation process. For example, the carrier wafer may be or include silicon, which may be thermally oxidized to form the bonding layer 104 of silicon dioxide.

The front side interconnection layer 108 includes a plurality of metallization layers which may be electrically coupled to one another by one or more conductive vias. The metallization layers extend between electrical contacts 124 and one or more of the header circuitry 112, the input/output circuitry 114, and the semiconductor device layer 110. In some embodiments, the metallization layers electrically couple a power contact 124*a* to the header circuitry 112. In some embodiments, the metallization layers electrically couple an input/output contact 124*b* to the input/output layer 114.

The front side interconnection structure 108 may further include an insulation layer 126 covering the various metallization layers and vias of the front side interconnection structure 108. The insulation layer 126 may be formed of any suitable insulation material, and in some embodiments, the insulation layer 126 electrically insulates or isolates the various electrical features within the front side interconnection structure 108 from one another. In some embodiments, the insulation layer 126 may be formed of a dielectric material, which may include one or more of silicon dioxide ($SiO_2$), SiON, SiOC and SiOCN or any other suitable insulating material. The insulation layer 126 may be disposed on and in contact with the front side of the semiconductor device layer 110, the header circuitry 112, and the input/output circuitry 114.

As shown in FIG. 1A, physical failure analysis (PFA) may be performed on the device 100. The PFA may be performed to test the functionality of the device 100, such as the functioning of the semiconductor devices in the semiconductor device layer 110. In some embodiments, the PFA may be performed to automatically identify or detect defects or hotspots in the device 100, such as defects or hotspots in the semiconductor device layer 110. Such defects may include hotspots (e.g., "IR" voltage drops), which may result from various issues, such as high resistance regions in the backside power rail 116, insufficient space and/or line width margins, or the like. Moreover, in some embodiments, the PFA may be performed to automatically identify or detect defects in the semiconductor devices in the semiconductor device layer 110, which may include, for example, defects hotspots, as well as defects associated with formation of the semiconductor devices.

In some embodiments, PFA testing may be performed from the backside of the device 100. For example, during PFA testing, a PFA tester 130 may be utilized to irradiate the device 100 from the backside with any suitable radiation. In some embodiments, the PFA tester 130 may be an emission microscopy (EMMI) tester. Emission microscopy (EMMI) is an efficient optical analysis technique used to detect and localize certain integrated circuit (IC) failures, such as failures within the semiconductor device layer 110. Emission microscopy is non-invasive and can be performed from either the front or back side of devices; however, as shown in FIG. 1A, emission microscopy may be performed from the backside of the device 100. Many device defects induce faint light emission in the visible and near infrared (IR) spectrum which may be detected during the PFA testing of the device 100.

In some embodiments, one or more cameras (not shown) are included as part of the PFA tester 130. For example, emission microscopy may utilize a sensitive camera to view and capture the optical emissions from the semiconductor device layer 110, which may be correlated with defects, thereby facilitating detection and localization of certain IC defects. Since emissions can be detected from the back side, EMMI may use an IR laser to create an overlay image of circuitry through the die. This allows failures to be related directly to circuit features, speeding failure resolution. A typical EMMI photo consists of an overlay of two images: the circuitry and the emission spots. Each may be arbitrarily colorized a different way for clarity.

In some embodiments, the PFA tester 130 may be a laser tester which irradiates the backside of the device 100 with laser radiation. For example, the PFA tester 130 may be or utilize laser signal injection microscopy (LSIM) or any other laser testing technique.

In some embodiments, PFA testing may include testing the device 100 with a physical wafer test apparatus or wafer tester. The wafer tester may be any conventional wafer test apparatus which may be utilized in physical failure analysis. For example, the wafer tester may include a wafer prober (not shown) which may apply one or more electrical test patterns to each of a plurality of dies on a semiconductor device, such as in the semiconductor device layer 110. The wafer tester may be positioned, for example, at the front side of the device 100 (e.g., on or connected to the electrical contacts 124), and may apply one or more electrical test signals (e.g., electrical test vectors) to the device 100 and to the semiconductor device layer 110 during PFA testing. The PFA testing may thus be utilized to diagnose or detect defects or failures in the semiconductor device layer 110.

Figure 1B:
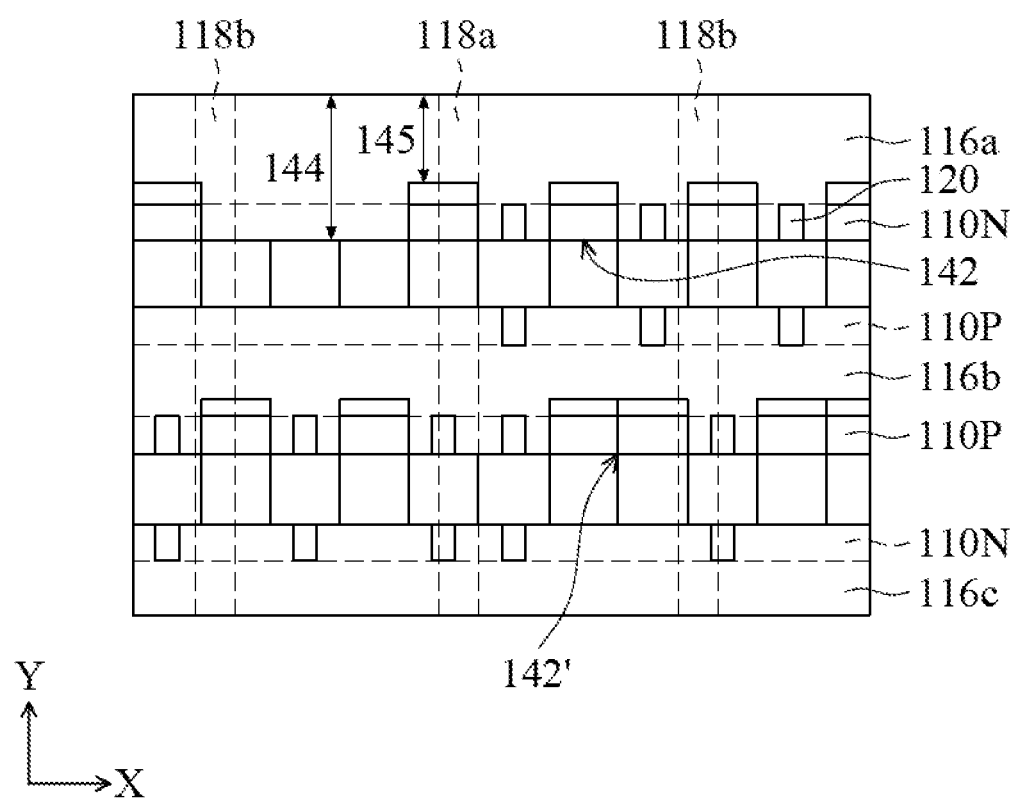
FIG. 1B is a plan view illustrating the backside power delivery network, the backside power rail, and the backside vias of the backside interconnection structure of the device shown in FIG. 1A, in accordance with some embodiments.

FIG. 1B is a plan view illustrating the backside power delivery network 118, the backside power rail 116, and the backside vias 120 of the backside interconnection structure 106 of the device 100. The plan view of FIG. 1B is in the X-Y plane from the backside of the device, e.g., along the direction 125 illustrated in FIG. 1A.

As shown in FIG. 1B, the semiconductor device layer 110 includes a plurality of diffusion regions 110N, 110P. The diffusion regions may include n-type diffusion regions 110N, and p-type diffusion regions 110P. The n-type diffusion regions 110N may have an n-type conductivity and may be doped with one or more n-type dopants, while the p-type diffusion regions 110P may have a p-type conductivity and may be doped with one or more p-type dopants.

The diffusion regions 110N, 110P may extend along a first direction (e.g., the x-axis direction as shown in FIG. 1B) and may be parallel with one another and spaced apart from one another. In some embodiments, the diffusion regions 110N, 110P form source/drain regions of transistors within the semiconductor device layer 110. The arrangement of the n-type and p-type diffusion regions 110N, 110P facilitates formation and selective operation of transistors of different conductivity types in the semiconductor device layer 110. For example, the semiconductor device layer 110 may include p-type transistors, such as a p-type metal oxide semiconductor (PMOS) transistor, and n-type transistors, such as an n-type metal oxide semiconductor (NMOS) transistor. The gate electrodes of the transistors may connected to control signals that are used to turn on and turn off the transistors. In some embodiments, the control signals may be provided, for example, from the header circuitry 112.

In some embodiments, one or more of the transistors has a conduction region (e.g., a source/drain region) in the diffusion regions 110N, 110P that is operably connected to a first voltage source (e.g., VDD) of a first backside power rail. For example, the conduction region of the PMOS transistors may be operably connected to the first voltage source in some embodiments. In some embodiments, one or more transistors has a conduction region (e.g., a source/drain region) in the diffusion regions 110N, 110P that is operably connected to a second voltage source (e.g., VDD) of a second backside power rail. For example, the conduction region of the NMOS transistors may be operably connected to the second voltage source in some embodiments.

As shown in FIG. 1B, the power delivery network 118 may include one or more first power delivery lines 118*a* and one or more second power delivery lines 118*b*. The first power delivery lines 118*a* extend along a second direction (e.g., the y-axis direction as shown in FIG. 1B) that is transverse to the first direction. In some embodiments, the second direction is orthogonal or substantially orthogonal to the first direction. The first power delivery lines 118*a* are configured to selectively receive or deliver voltage from a first voltage source (e.g., VDD) to one or more of the backside power rails 116. For example, each the first power delivery lines 118*a* may be electrically coupled to one or more of the backside power rails 116, and thus may selectively receive or delivery voltage from the first voltage source to the one or more backside power rails 116.

The one or more second power delivery lines 118*b* extend along the second direction and may be parallel or substantially parallel to the first power delivery lines 118*a* and may be spaced apart from one another and from the first power delivery lines 118*a* along the first direction (e.g., the x-axis direction). The second power delivery lines 118*b* are configured to selectively receive or deliver voltage from a second voltage source (e.g., VSS) to one or more of the backside power rails 116. For example, each the second power delivery lines 118*a* may be electrically coupled to one or more of the backside power rails 116, and thus may selectively receive or delivery voltage from the second voltage source to the one or more backside power rails 116. The voltage of the second voltage source may be different than the voltage of the first voltage source in some embodiments.

As shown in FIG. 1B, the backside power rail 116 may include a plurality of power rails 116*a*, 116*b*, 116*c* that extend generally along the first direction (e.g., the x-axis direction). The power rails 116*a*, 116*b*, 116*c* are spaced apart from one another along the second direction, as shown. The power rails 116*a*, 116*b*, 116*c* may be electrically coupled to the diffusion regions 110N, 110P of the semiconductor device layer 110, for example, by the backside vias 120. The backside vias 120 may extend through portions of the insulation layer 122 to connect various regions of the diffusion regions 110N, 110P to the power rails 116*a*, 116*b*, 116*c*. Accordingly, the power rails 116*a*, 116*b*, 116*c* are configured to deliver or receive electrical signals (e.g., VDD or VSS) to or from the semiconductor devices in the semiconductor device layer 110, such as to or from conduction regions (e.g., a source/drain region) of semiconductor devices in the diffusion regions 110N, 110P.

As shown in FIG. 1B, portions of the diffusion regions 110N, 110P of the semiconductor device layer 110 are exposed through openings 142 in the power rails 116*a*, 116*b*. For example, a first power rail 116*a* may include openings 142 that expose portions of the underlying diffusion region 110N, as shown. A second power rail 116*b* may substantially or completely overlap a first underlying diffusion region of a first type (e.g., p-type diffusion region 110P, as shown) and may include openings 142 that expose portions of an adjacent underlying diffusion region of the first type (e.g., the adjacent p-type diffusion region 110P). In various embodiments, one or more of the power rails 116*a*, 116*b*, 116*c* may substantially or completely overlap a diffusion region of a first type, while the openings 142 may expose portions of a diffusion region of a second type.

Each of the power rails 116*a*, 116*b*, 116*c* may have a first width 144 measured along the second direction (e.g., the y-axis direction), which may be a maximum width of the power rails 116*a*, 116*b*, 116*c*, as shown. At the openings 142, however, the power rails 116*a*, 116*b*, 116*c* have a second width 145 measured along the second direction that is less than the first width 144. That is, the smaller second width 145 of the power rails 116*a*, 116*b*, 116*c* defines the openings 142, which extend inwardly into the power rails 116*a*, 116*b*, 116*c* from the first width 144.

In some embodiments, large openings 142' may be formed in one or more of the power rails 116*a*, 116*b*, 116*c*. The large openings 142' may be substantially twice as long (e.g., in the x-axis direction) than the openings 142. For example, the large openings 142' may be two openings 142 formed successively and continuously with one another along a length.

The openings 142, 142' facilitate or improve backside PFA testing of the device 100, as the openings 142 expose portions of the diffusion regions 110N, 110P of the semiconductor device layer 110, so that the exposed portions of the diffusion regions 110N, 110P can be imaged or otherwise detected by the PFA tester 130 from the backside of the device 100. That is, the backside power rails 116 do not block the PFA tester 130 from viewing, imaging, or otherwise detecting portions of the diffusion regions 110N, 110P.

Figure 1C:
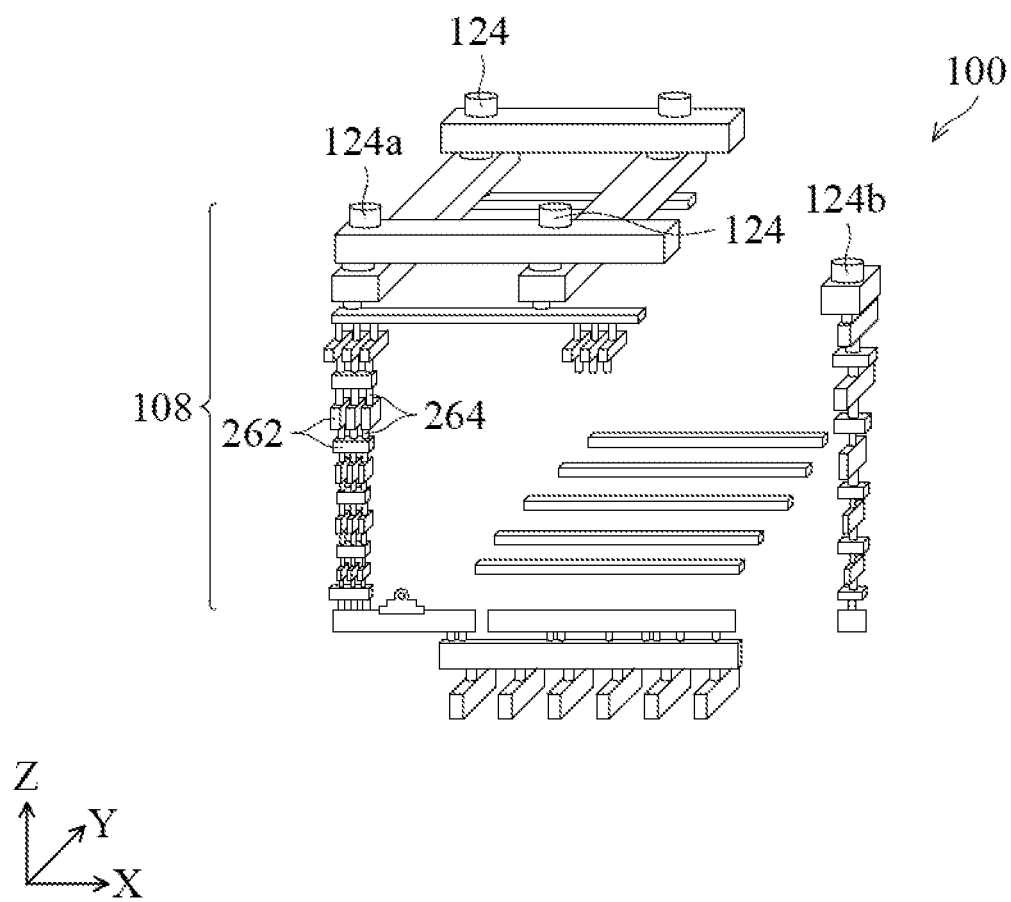
FIG. 1C is a 3-dimensional view schematically illustrating features of the front side interconnection structure of the device shown in FIG. 1A, in accordance with some embodiments.

FIG. 1C is a 3-dimensional view schematically illustrating features of the device 100. In particular, FIG. 1C illustrates the front side interconnection structure 108 in further detail. As shown in FIG. 1C, the front side interconnection structure 108 includes a plurality of metallization layers 262 which may be electrically coupled to one another by one or more conductive vias 264. Any number of metallization layers may be included in the front side interconnection structure 108. While the illustration of FIG. 1C only shows portions of the metallization layers, it will be readily appreciated that each of the metallization layers may include conductive lines which extend in various pathways along a plane including the first direction (e.g., the x-axis direction) and the second direction (e.g., the y-axis direction).

The metallization layers are connected by the conductive vias 264 to provide a conductive path between the electrical contacts 124 and one or more of the header circuitry 112, the input/output circuitry 114, and the semiconductor device layer 110.

Figure 2:
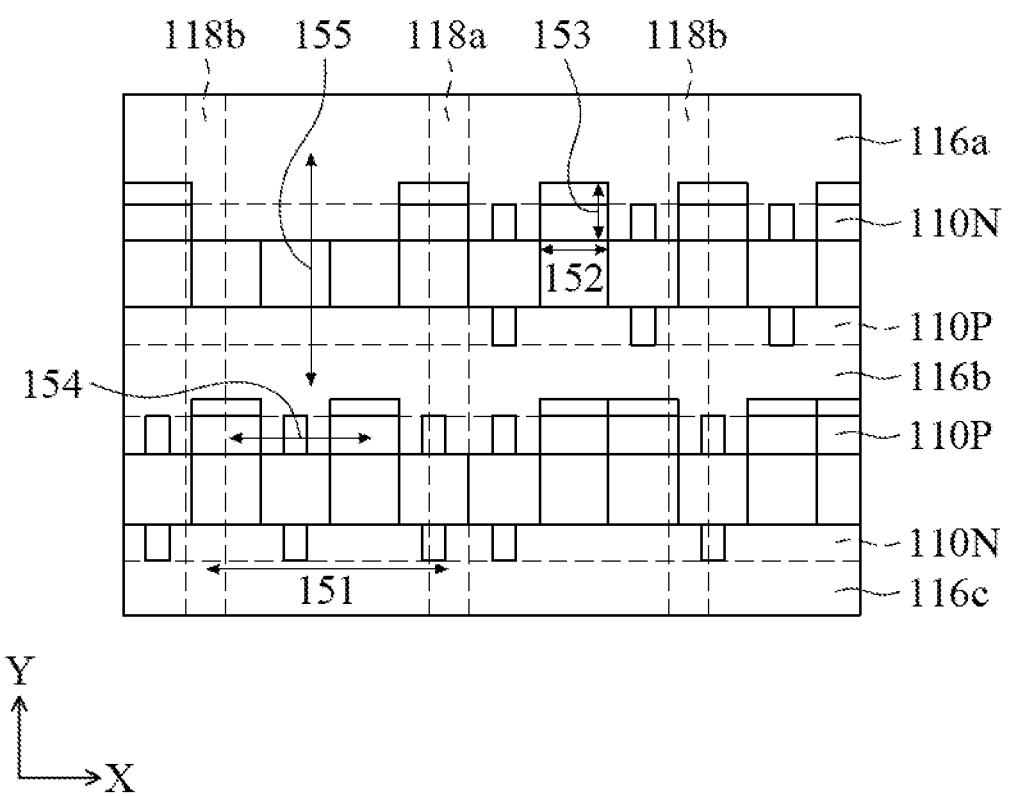
FIG. 2 is a plan view illustrating the backside power delivery network, the backside power rail, and the backside vias of the backside interconnection structure of the device of FIG. 1A, in accordance with some embodiments.

FIG. 2 is a plan view illustrating the backside power delivery network 118, the backside power rail 116, and the backside vias 120 of the backside interconnection structure 106 of the device 100. The view of FIG. 2 is the same as the view illustrated in FIG. 1B; however, FIG. 2 illustrates additional dimensions with respect to the backside power delivery network 118, the backside power rail 116, and the backside vias 120 of the backside interconnection structure 106.

As shown in FIG. 2, the power lines 118 (e.g. 118*a*, 118*b*) of the power delivery network may have a pitch 151 which may be measured along the first direction (e.g., x-axis direction) between a first power line 118*a* (e.g., a center of the first power line 118*a*) and a second power line 118*b* (e.g., a center of the second power line 118*b*). In some embodiments, the pitch 151 is greater than the gate pitch of the transistors of the semiconductor device layer 110, which may be referred to as a contacted poly pitch (CPP). In some embodiments, the pitch 151 is greater than twice the contacted poly pitch of the transistors of the semiconductor device layer 110. In some embodiments, the pitch 151 is less than 50 times the contacted poly pitch, and in some embodiments, the pitch 151 is less than 25 times the contacted poly pitch. In some embodiments, the pitch 151 is within a range from about 2 times the contacted poly pitch to about 24 times the contacted poly pitch. In some embodiments, the pitch 151 is within a range from about 90 nm to about 1000 nm.

The openings 142 may have a length 152 along the first direction (e.g., x-axis direction) that is equal or substantially equal to the contacted poly pitch of the transistors of the semiconductor device layer 110, in some embodiments. In some embodiments, the length 152 of the openings 142 is greater than the contacted poly pitch. In some embodiments, the length 152 is less than 25 times the contacted poly pitch, and in some embodiments, the length 152 is less than 15 times the contacted poly pitch. In some embodiments, the length 152 is within a range from about 1 times the contacted poly pitch to about 10 times the contacted poly pitch. In some embodiments, the length 152 is within a range from about 45 nm to about 450 nm. These dimensions for the length 152 of the openings 142 facilitate or improve backside PFA testing of the device 100, as the openings 142 are sized to expose portions of the diffusion regions 110N, 110P of the semiconductor device layer 110 having sufficiently sized dimensions so that the exposed portions of the diffusion regions 110N, 110P can be suitably imaged or otherwise detected by the PFA tester 130 from the backside of the device 100.

The openings 142 may have a width 153 along the second direction (e.g., y-axis direction) that is equal or substantially equal to the width of the diffusion layers 110N, 110P along the second direction. In some embodiments, the width 153 of the openings 142 may be greater than the width of the diffusion layers 110N, 110P. In some embodiments, the width 153 of the openings 142 may be less than the width of the diffusion layers 110N, 110P. In some embodiments, the width 153 is within a range from about 10 nm less than the width of the diffusion layers 110N, 110P to about 10 nm more than the width of the diffusion layers 110N, 110P. In some embodiments, the width 153 is within a range from about 20 nm to about 40 nm. In some embodiments, the width 153 of the openings 142 is less than the length 152 of the openings 142. These dimensions for the width 153 of the openings 142 facilitate or improve backside PFA testing of the device 100, as the openings 142 are sized to expose portions of the diffusion regions 110N, 110P of the semiconductor device layer 110 having sufficiently sized dimensions so that the exposed portions of the diffusion regions 110N, 110P can be suitably imaged or otherwise detected by the PFA tester 130 from the backside of the device 100.

As shown in FIG. 2, the openings 142 of the power lines 118 of the power delivery network may have a pitch 154 which may be measured along the first direction (e.g., x-axis direction) between adjacent openings 142 of the power lines (e.g., between centers of the adjacent openings 142). In some embodiments, the pitch 154 is greater than the contacted poly pitch of the transistors of the semiconductor device layer 110. In some embodiments, the pitch 154 is greater than twice the contacted poly pitch of the transistors of the semiconductor device layer 110. In some embodiments, the pitch 154 is less than 20 times the contacted poly pitch, and in some embodiments, the pitch 154 is less than 10 times the contacted poly pitch. In some embodiments, the pitch 154 is within a range from about 2 times the contacted poly pitch to about 10 times the contacted poly pitch. In some embodiments, the pitch 154 is within a range from about 90 nm to about 450 nm. In some embodiments, the pitch 154 of the openings 142 is less than the pitch 151 of the power lines 118.

As shown in FIG. 2, the backside power rails 116 may have a pitch 155 which may be measured along the second direction (e.g., y-axis direction) between a first power rail 116a (e.g., a center of the first power rail 116a) and a second power rail 116b (e.g., a center of the second power rail 116b). In some embodiments, the pitch 155 is less than the cell height of the transistors or other features of the semiconductor device layer 110. In some embodiments, the pitch 155 is within a range from about ½ the cell height to about 1 times the cell height. In some embodiments, the pitch 155 is within a range from about 50 nm to about 100 nm.

The dimensions of the backside power delivery network 118, the backside power rail 116, and the backside vias 120 of the backside interconnection structure 106 shown in FIG. 2 provide several advantages, including reducing device scaling or increasing the density of semiconductor devices that may be provided in the semiconductor device layer 110 while also facilitating improved backside PFA testing, as the portions of the diffusion layers 110N, 110P exposed through the openings 142 may be suitably imaged.

Figure 3A:
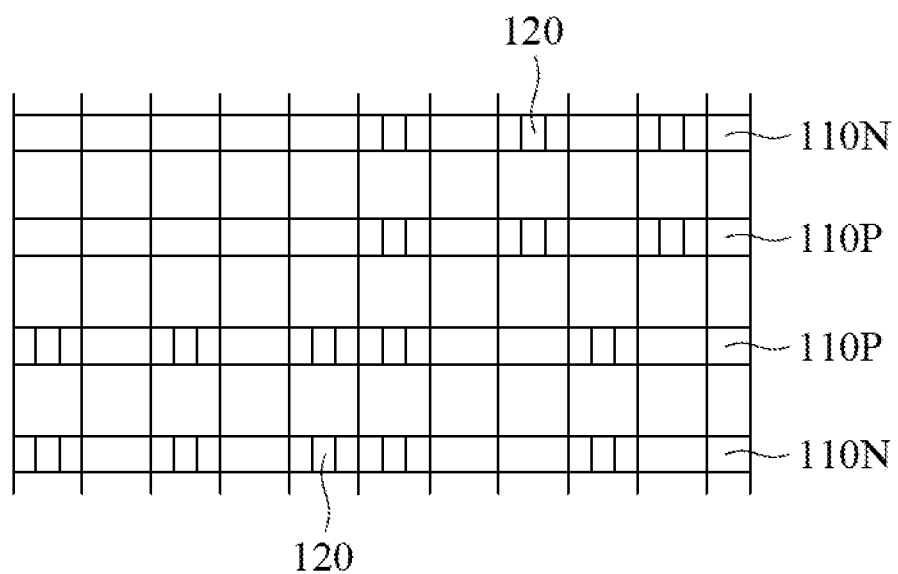
FIGS. 3A through 3C are plan views illustrating a method of fabricating the backside power delivery network, the backside power rail, and the backside vias of the backside interconnection structure, in accordance with some embodiments.
Figure 3B:
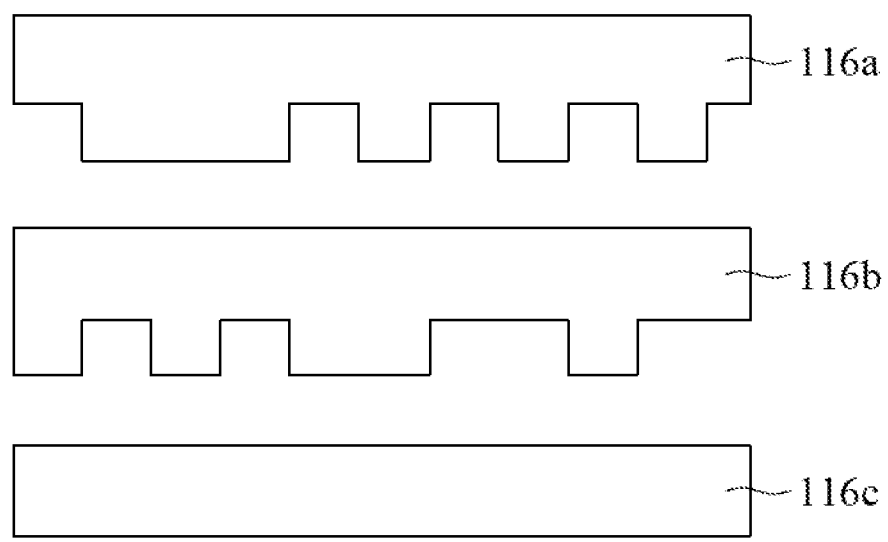
Figure 3C:
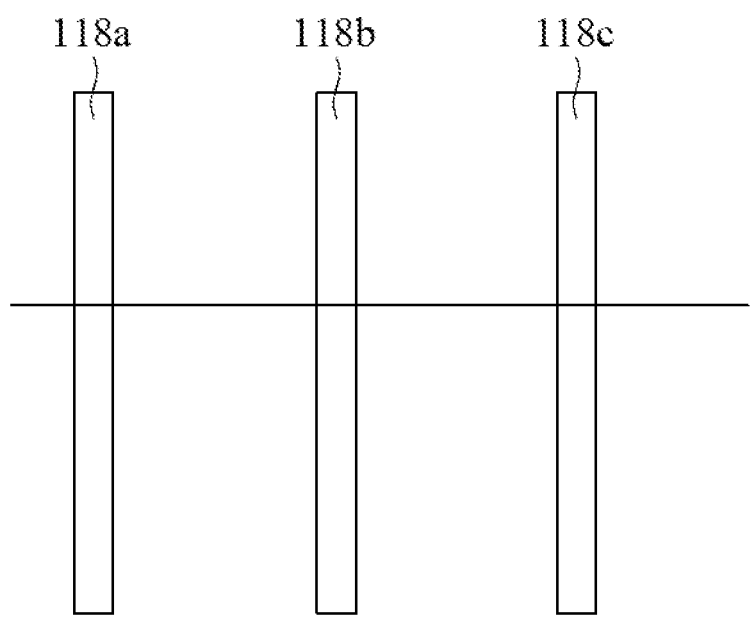

FIGS. 3A through 3C are plan views illustrating a method of fabricating the backside power delivery network 118, the backside power rail 116, and the backside vias 120 of the backside interconnection structure 106.

As shown in FIG. 3A, the backside vias 120 may be formed on regions of the diffusion layers 110N, 110P. The backside vias 120 may be formed by any suitable technique. For example, in some embodiments, the backside vias 120 may be formed by an etching process that defines via openings that extend through portions of the insulation layer 122 and expose portions (e.g., source/drain regions) of the diffusion regions 110N, 110P. The openings may then be at least partially filled with a conductive material, thereby forming the backside vias 120.

As shown in FIG. 3B, the backside power rail 116 is formed over the backside vias 120 and the diffusion layers 110N, 110P. FIG. 3B illustrates only the backside power rail 116 for ease of illustration; however, it will be readily appreciated that the backside power rail 116 is formed over the backside vias 120 and the diffusion layers 110N, 110P.

The backside power rail 116 may include a plurality of power rails 116a, 116b, 116c that extend generally along the first direction (e.g., the x-axis direction). The power rails 116a, 116b, 116c are spaced apart from one another along the second direction, as shown. The power rails 116a, 116b, 116c may be formed on portions of the insulation layer 122 and are formed to contact the backside vias 120. Accordingly, the backside vias 120 may connect various regions of the diffusion regions 110N, 110P to the power rails 116a, 116b, 116c. The power rails 116a, 116b, 116c are configured to deliver or receive electrical signals (e.g., VDD or VSS) to or from the semiconductor devices in the semiconductor device layer 110, such as to or from conduction regions (e.g., a source/drain region) of semiconductor devices in the diffusion regions 110N, 110P.

The backside power rail 116 may be formed by any suitable technique. For example, in some embodiments, the backside power rail 116 is formed by a patterned deposition to form the power rails 116a, 116b, 116c having the shapes and dimensions as discussed previously herein. For example, portions of the insulation layer 122 may be selectively removed by a photolithography or other patterning process, and the backside power rails 116a, 116b, 116c may be deposited.

As shown in FIG. 3C, the power delivery network 118 is formed over the backside power rail 116. The power delivery network 118 may include one or more first power delivery lines 118a and one or more second power delivery lines 118b. The first power delivery lines 118a extend along the second direction (e.g., the y-axis direction) that is transverse to the first direction. The first power delivery lines 118a are configured to selectively receive or deliver voltage from a first voltage source (e.g., VDD) to one or more of the backside power rails 116. For example, each the first power delivery lines 118a may be electrically coupled to one or more of the backside power rails 116, and thus may selectively receive or deliver voltage from the first voltage source to the one or more backside power rails 116. The second power delivery lines 118b are configured to selectively receive or deliver voltage from a second voltage source (e.g., VSS) to one or more of the backside power rails 116. For example, each the second power delivery lines 118b may be electrically coupled to one or more of the backside power rails 116, and thus may selectively receive or deliver voltage from the second voltage source to the one or more backside power rails 116.

The power delivery network 118 may be formed by any suitable technique. For example, in some embodiments, the power delivery network is formed by a patterned deposition to form the power delivery lines 118a, 118b having the shapes and dimensions as discussed previously herein.

In some embodiments, the insulation layer 122 is formed in a multi-layer process. For example, a first layer of the insulation layer 122 may be formed substantially surrounding the backside vias 120, a second layer of the insulation layer 122 may be formed surrounding the backside power rail 116, and a third layer of the insulation layer 122 may be formed surrounding the power delivery network 118.

FIGS. 4A through 4G illustrate a method of fabricating the device 100, in accordance with some embodiments.

Figure 4A:
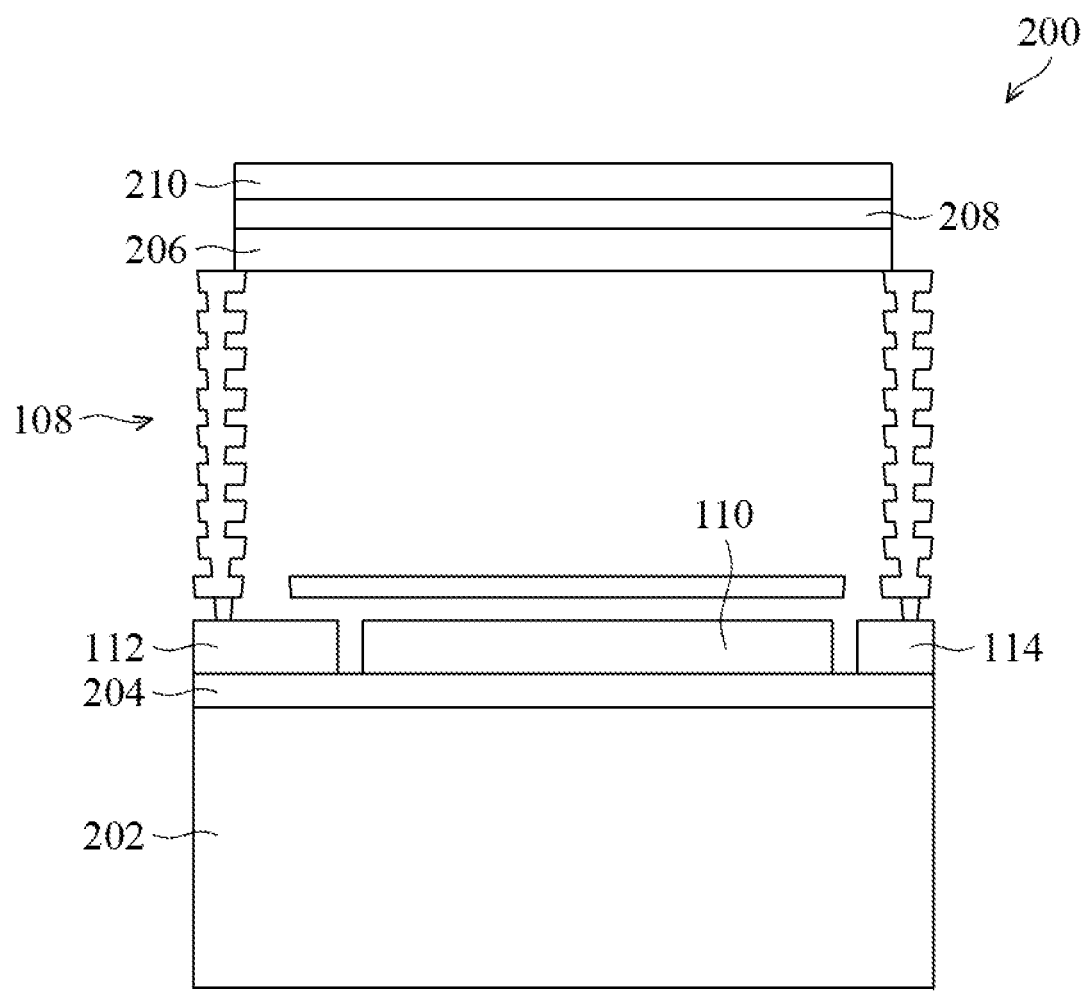
FIGS. 4A through 4G illustrate a method of fabricating a semiconductor device, in accordance with some embodiments.

As shown in FIG. 4A, the method may begin with receiving a semiconductor device 200. The device 200 includes the semiconductor device layer 110, header circuitry 112, input/output layer 114, and front side interconnection structure 108, which may be the same or substantially the same as previously described herein.

The device 200 further includes a substrate 202 that is attached at a backside of the semiconductor device layer 110. In some embodiments, a stop layer 204 may be included between the substrate 202 and the backside of the semiconductor device layer 110. The substrate 202 may be any suitable substrate. In some embodiments, the substrate 202 is a semiconductor substrate, such as a silicon substrate. In some embodiments, the stop layer 204 is a semiconductor layer, such as a silicon germanium (SiGe) layer.

In some embodiments, a substrate 206 is attached at the front side of the front side interconnection structure 108, as shown. The substrate 206 may be any suitable substrate, and in some embodiments, the substrate 206 is a dielectric layer or a dielectric substrate. In some embodiments, the substrate 206 may be an electrical insulator, such as a dielectric layer, that is used as an electrical insulation material between active regions or conductive lines of the device 200. For example, the substrate 206 may electrically insulate portions of conductive lines or features of the front side interconnection structure 108 from one another or from the electrical contacts 124 (e.g., 124a, 124b). In some embodiments, the substrate 206 is a glass substrate. In some embodiments, the substrate 206 is an undoped silicate glass substrate.

In some embodiments, the substrate 206 is bonded to the front side of the front side interconnection structure 108, for example, utilizing any suitable bonding technique. In some embodiments, the substrate 206 is formed by any suitable techniques, including, for example, by deposition. In some embodiments, the substrate 206 is an undoped silicate glass substrate or layer that is deposited by plasma enhanced CVD (PECVD), HDP-CVD, SACVD, or any suitable deposition technique.

In some embodiments, a dielectric layer 208 is formed on the substrate 206. The dielectric layer 208 may be formed of any suitable dielectric material. In some embodiments, the dielectric layer 208 is a silicon nitride (SiN) layer. In some embodiments, an oxide layer 210 is formed on the dielectric layer 208. In some embodiments, the oxide layer 210 is a high-density plasma oxide.

Figure 4B:
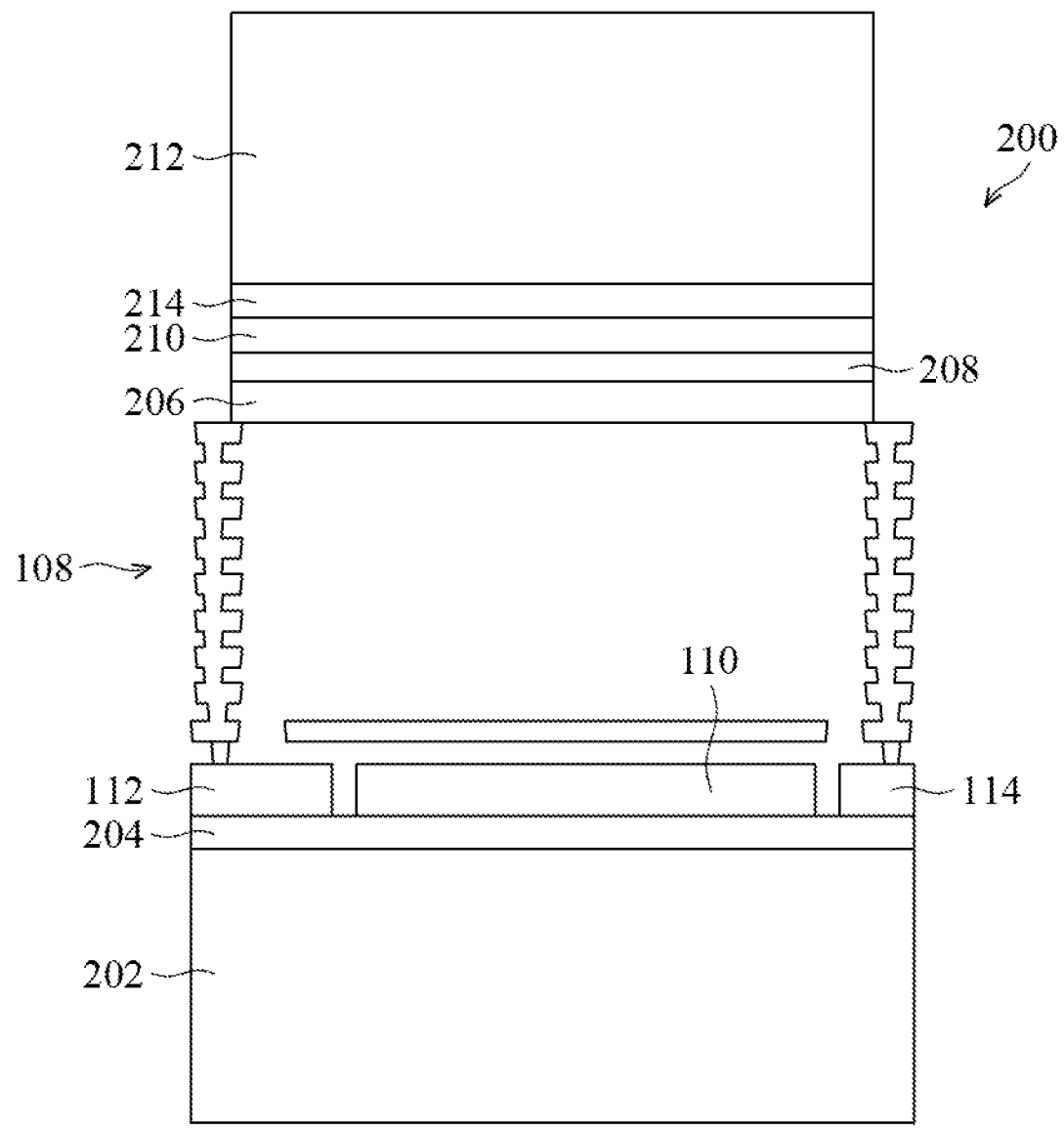

As shown in FIG. 4B, the method includes bonding a carrier substrate 212 to the device 200. The carrier substrate 212 may be bonded to the front side of the front side interconnection structure 108 of the device 200 by any suitable technique. In some embodiments, the carrier substrate 212 is bonded to the device 200 (e.g., bonded to the substrate 206) by a thermal oxidation process. For example, the carrier substrate 212 may be a semiconductor substrate capable of forming an thermal oxide layer through a thermal oxidation process, which may be a conventional thermal oxidation process in some embodiments. In some embodiments, the carrier substrate 212 may be a silicon substrate, and the thermal oxidation may result in the formation of an oxide layer 214 that bonds the carrier substrate 212 to the device 200, e.g., to the oxide layer 210.

Figure 4C:
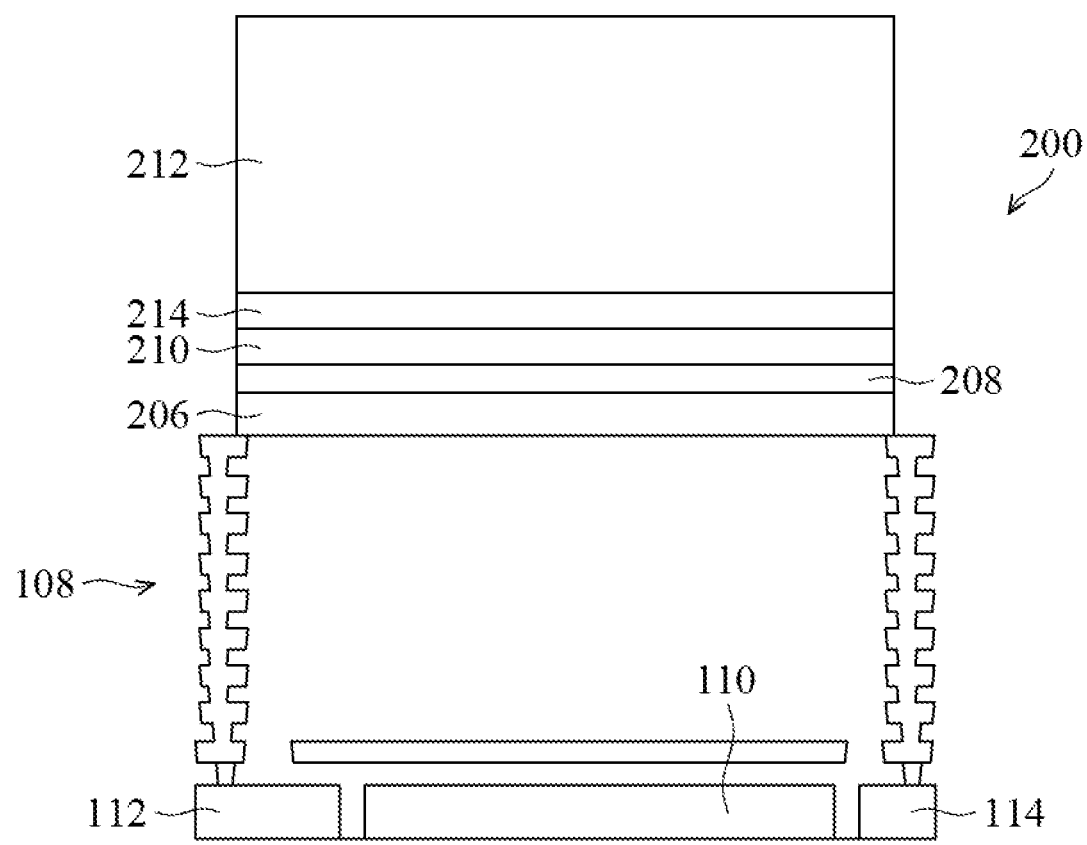

As shown in FIG. 4C, the substrate 202 and the stop layer 204 are removed at the backside of the device 200. The substrate 202 and the stop layer 204 may be removed by any suitable technique. In some embodiments, the substrate 202 and the stop layer 204 may be removed by selectively removing the stop layer 204, which causes release and removal of the substrate 202. For example, in some embodiments, the stop layer 204 may be removed by an etching process that selectively removes the stop layer 204, thereby freeing the substrate 202 from the device 200 and allowing for removal of the substrate 202 and the stop layer 204.

In some embodiments, the substrate 202 and the stop layer 204 may be removed by a thin down process. The thin down process may include any suitable thin down process, including, for example, mechanical grinding, chemical mechanical polishing (CMP), wet etching and atmospheric downstream plasma (ADP) dry chemical etching (DCE).

Figure 4D:
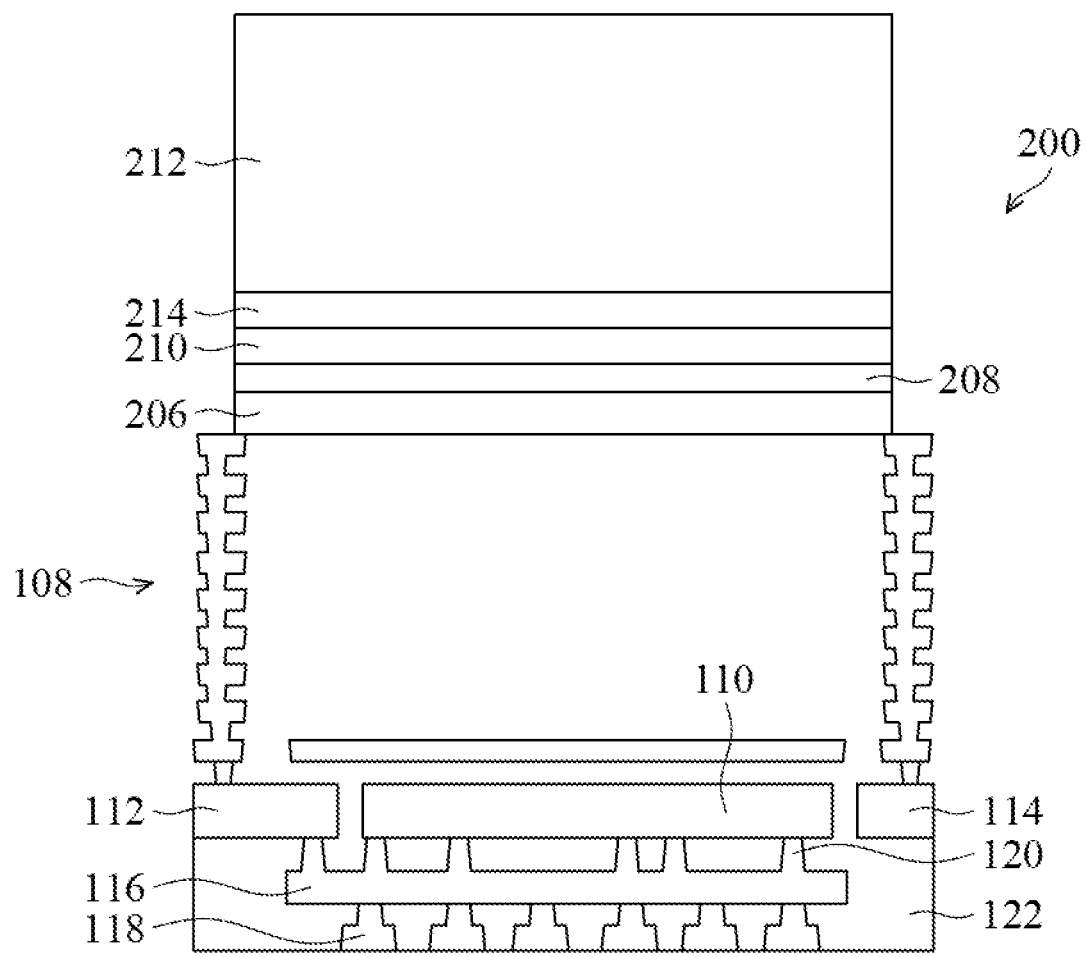

As shown in FIG. 4D, the backside interconnection structure 106 is formed at the backside of the device 200. In some embodiments, formation of the backside interconnection structure 106 includes forming the insulation layer 122 on the backside of the device 200, and forming the backside interconnection structure 106 in the insulation layer 122.

The backside interconnection structure 106 may be formed, for example, by the process shown and described with respect to FIGS. 3A to 3C. For example, the backside interconnection structure 106 may be formed by forming the backside vias 120 extending through the insulation layer 122 and contacting regions (e.g., source/drain regions) of the diffusion regions 110N, 110P of the semiconductor device layer 110. In some embodiments, one or more of the backside vias 120 are formed to contact electrical features within the header layer 112. The backside power rail 116 is formed over the backside vias 120 and the semiconductor device layer 110, and may include a plurality of power rails as previously discussed herein. The backside power rails may be formed on portions of the insulation layer 122 and are formed to contact the backside vias 120. The power delivery network 118 may be formed over the backside power rail 116, e.g., by deposition, and the power delivery lines 118a, 118b of the backside interconnection structure 106 may be formed to contact one or more of the backside power rails 116.

The insulation layer 122 is formed to cover the backside power rail 116, the backside power delivery network 118, and the backside vias 12. The insulation layer 122 may be formed of any suitable insulation material, and in some embodiments, the insulation layer 122 electrically insulates or isolates the various electrical features within the backside interconnection structure 106 from one another. In some embodiments, the insulation layer 122 may be formed of a dielectric material, which may include one or more of silicon dioxide ($SiO_2$), SiON, SiOC and SiOCN or any other suitable insulating material.

Figure 4E:
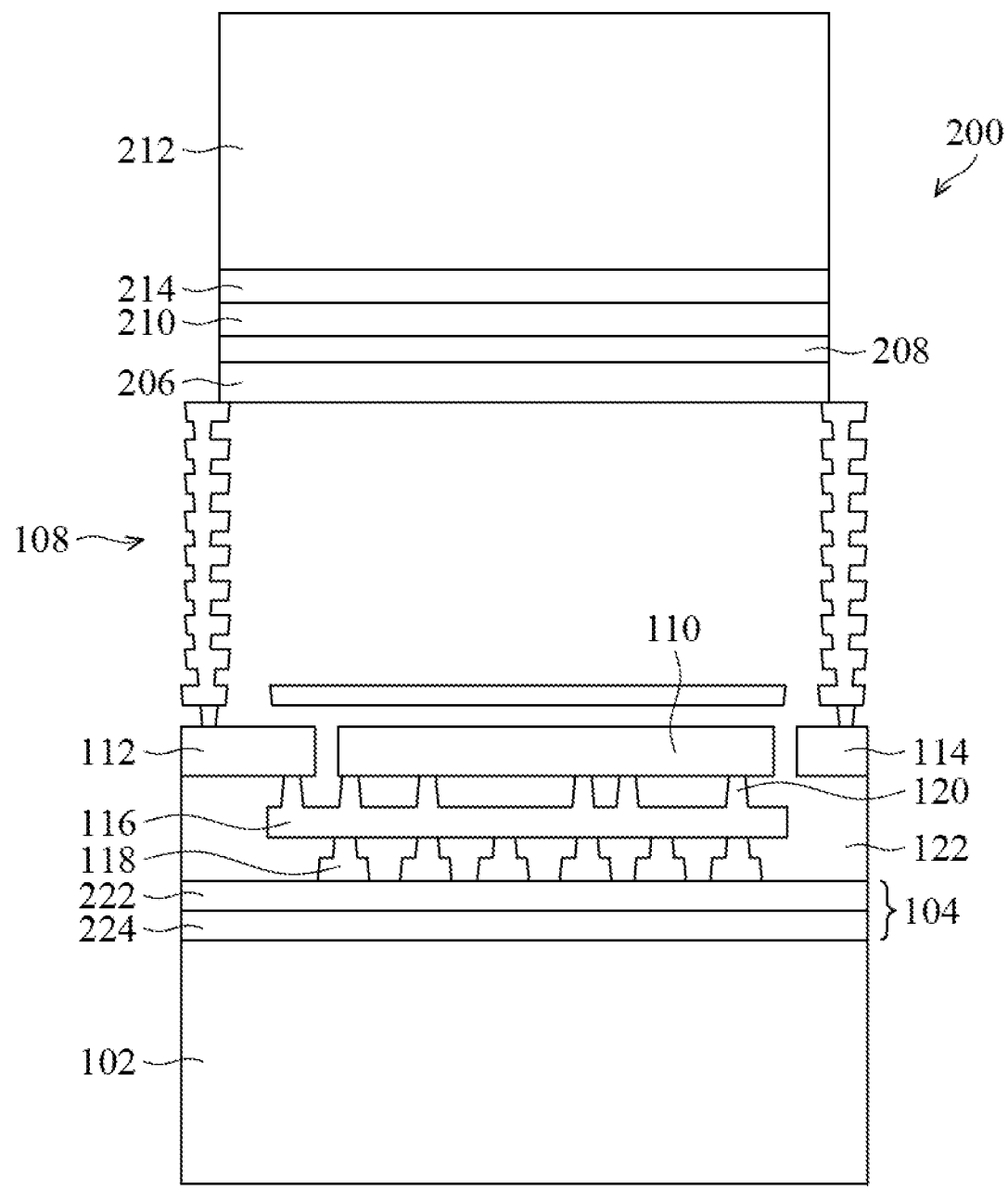

As shown in FIG. 4E, the method includes a second bonding process to bond the substrate 102 to the backside of the backside interconnection structure 106. In some embodiments, the substrate 102 may be bonded to the backside of the backside interconnection structure 106 by the bonding layer 104. The bonding layer 104 may be formed of any material to suitably bond the backside interconnection structure 106 and the substrate 102, which may be a carrier wafer. In some embodiments, the bonding layer 104 includes an oxide layer, such as silicon dioxide. However, embodiments provided herein are not limited thereto, and any other suitable material for the bonding layer 104 may be utilized in various embodiments. In some embodiments, the bonding layer 104 is formed by a thermal oxidation process. For example, the carrier wafer may be or include silicon, which may be thermally oxidized to form the bonding layer 104 of silicon dioxide. The thermal oxidation process may form an oxide layer 222 and a thermal oxidation layer 224, in some embodiments.

Figure 4F:
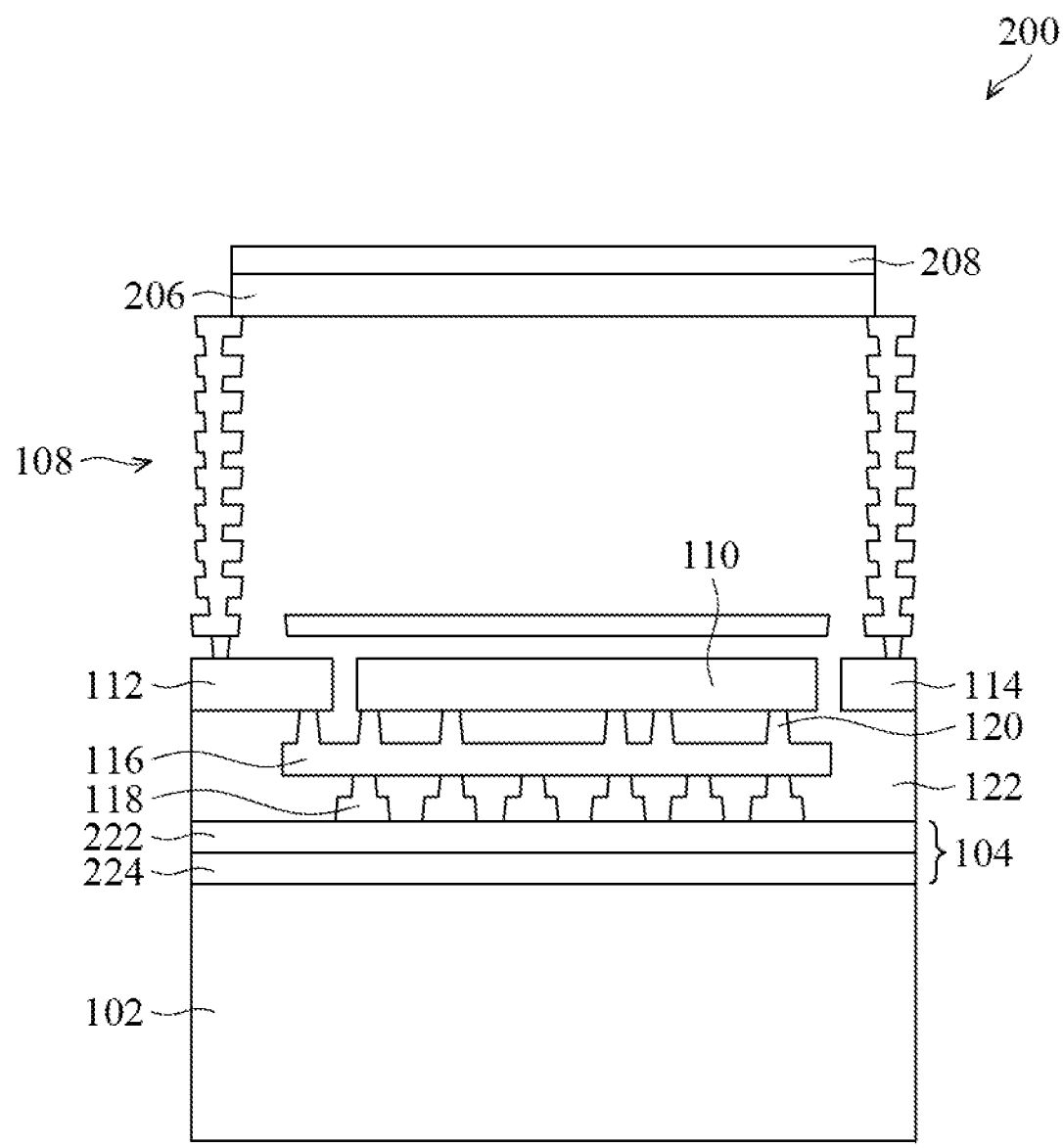

As shown in FIG. 4F, the substrate 212 is removed from the front side of the device 200. The substrate 212 may be removed by any suitable technique. In some embodiments, the substrate 212 may be removed by a thin down process. The thin down process may include any suitable thin down process, including, for example, mechanical grinding, chemical mechanical polishing (CMP), wet etching and atmospheric downstream plasma (ADP) dry chemical etching (DCE). In some embodiments, the oxide layer 214 and the oxide layer 210 are removed at the same time or during a same process as the removal of the substrate 212. In some embodiments, the dielectric layer 208 is exposed by the removal of the substrate 212.

Figure 4G:
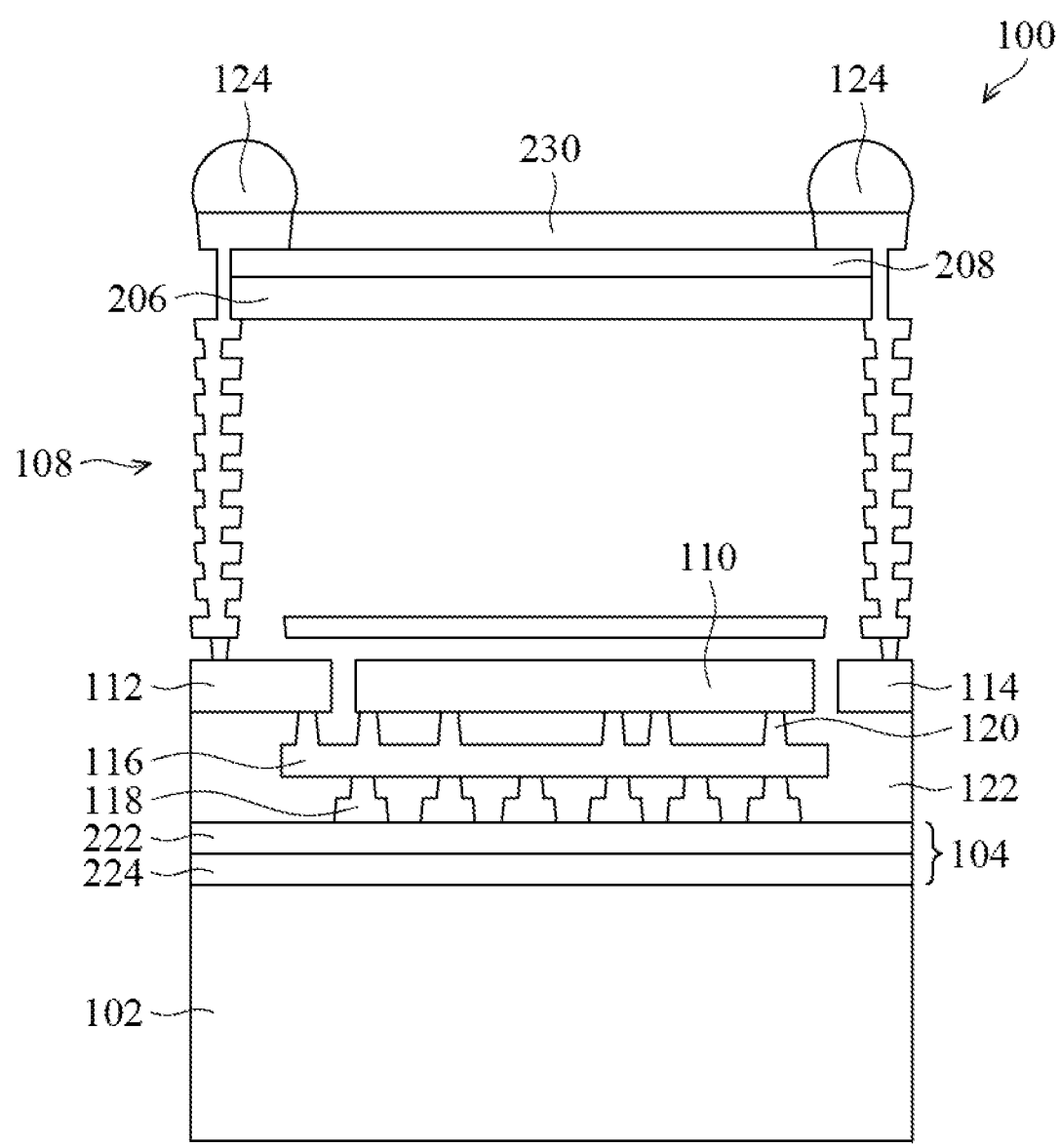

As shown in FIG. 4G, the device 100 is completed by forming the electrical contacts 124. The electrical contacts 124 may be formed by any suitable technique, including by deposition, soldering, placement of solder balls, or the like. The electrical contacts 124 may be formed on an upper most metallization layer of the backside interconnection structure 108. In some embodiments, the electrical contacts 124 may include power contacts and input/output contacts. While FIG. 4G illustrates only two electrical contacts 124, it will be readily appreciated that any number of electrical contacts may be included in the device 100 and may be coupled to various different metallization pathways, e.g., to electrically couple to the header circuitry 112, the semiconductor device layer 110, or the input/output layer 114.

The device 100 illustrated in FIG. 4G is substantially the same as the device 100 illustrated in FIG. 1A; however, FIG. 4G further shows that the substrate 206 and the dielectric layer 208 may remain at the top surface of the backside metallization structure 108, and the electrical contacts 124 may be formed over the substrate 206 and dielectric layer 208. Additionally, as shown in FIG. 4G, a dielectric layer 230 may be formed on the dielectric layer 208 and may extend between the electrical contacts 124.

Embodiments of the present disclosure provide several advantages. For example, the openings in the power rails allow physical failure analysis (PFA) testing to be performed from the backside of the semiconductor device layer without irradiation from the PFA tester being blocked by the power rails. Instead, the irradiation can reach the exposed portions of the semiconductor device layer through the openings. This results in improved PFA testing of the device, which results in yield improvement of the devices. Further, by placing the power rails at the backside of the device, additional area is available for signal routing at the front side.

Moreover, the power rails of the present disclosure facilitate a denser placement of semiconductor devices (e.g., transistors) while further allowing effective PFA testing of the devices without blockage by overlying power rails. Additionally, due to the presence of the openings in the power rails in some embodiments of the present disclosure, a maximum width of the power rails may be increased as compared to conventional power rails. This results in the power rails of the present disclosure having a lower resistance than conventional power rails.

According to one embodiment, a device includes a semiconductor device layer including a plurality of diffusion regions. A first interconnection structure is disposed on a first side of the semiconductor device layer, and the first interconnection structure includes at least one electrical contact. A second interconnection structure is disposed on a second side of the semiconductor device layer, and the second interconnection structure includes a plurality of backside power rails. Each of the backside power rails at least partially overlaps a respective diffusion region of the plurality of diffusion regions and defines openings which expose portions of the respective diffusion region at the second side of the semiconductor device layer.

In another embodiment, a method is provided that includes forming a plurality of backside power rails overlying a backside of a semiconductor device layer. The semiconductor device layer includes a plurality of diffusion regions, and each of the backside power rails at least partially overlaps a respective diffusion region of the plurality of diffusion regions and defines openings which expose portions of the respective diffusion region at the backside of the semiconductor device layer. A front side interconnection structure is disposed on a front side of the semiconductor device layer, and includes at least one electrical contact.

In yet another embodiment, a method includes forming a front side interconnection structure on a first side of a semiconductor device layer, and the front side interconnection structure includes at least one electrical contact. A backside interconnection structure is formed on a second side of the semiconductor device layer that is opposite the first side. Forming the backside interconnection structure includes forming a plurality of backside power rails, with each of the backside power rails at least partially overlapping a respective diffusion region of a plurality of diffusion regions of the semiconductor device layer and defining openings which expose portions of the respective diffusion region at the second side of the semiconductor device layer. The forming the backside interconnection structure further includes forming a backside power delivery network on the plurality of backside power rails, with the plurality of backside power rails disposed between the backside power delivery network and the second side of the semiconductor device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a semiconductor device layer including a plurality of diffusion regions, the semiconductor device layer having a first side and a second side opposite the first side;
a first interconnection structure on the first side of the semiconductor device layer, the first interconnection structure including at least one electrical contact; and
a second interconnection structure on the second side of the semiconductor device layer, the second interconnection structure including a plurality of backside power rails, each of the backside power rails at least partially overlapping a respective diffusion region of the plurality of diffusion regions and defining openings which expose portions of the respective diffusion region at the second side of the semiconductor device layer.

2. The device of claim 1, further comprising a substrate, the second interconnection structure disposed between the substrate and the semiconductor device layer.

3. The device of claim 1, wherein each of the backside power rails has a length extending along a first direction, and the openings have a length along the first direction that is within a range from 45 nm to 450 nm.

4. The device of claim 1, wherein each of the backside power rails has a length extending along a first direction, and the openings have a length along a second direction that is within a range from 20 nm to 40 nm, the second direction being transverse to the first direction.

5. The device of claim 1, wherein each of the backside power rails has a length extending along a first direction, and a pitch between adjacent backside power rails of the plurality of backside power rails along a second direction transverse to the first direction is within a range from 50 nm to 100 nm.

6. The device of claim 1, wherein each of the backside power rails has a length extending along a first direction, and a pitch between adjacent openings of at least one of the backside power rails is within a range from 90 nm to 450 nm.

7. The device of claim 1, further comprising a backside power delivery network on the plurality of backside power rails, the plurality of backside power rails disposed between the backside power delivery network and the second side of the semiconductor device layer.

8. The device of claim 7, wherein the backside power rails extend along a first direction, and the backside power delivery network includes a plurality of power delivery lines extending along a second direction that is transverse to the first direction.

9. The device of claim 8, wherein a pitch between adjacent ones of the plurality of power delivery lines along the first direction is within a range from 90 nm to 1000 nm.

10. The device of claim 1, further comprising:
power management circuitry spaced laterally apart from the semiconductor device layer,
wherein the at least one electrical contact is electrically coupled to the power management circuitry through the first interconnection structure.

11. A method, comprising:
forming a plurality of backside power rails overlying a backside of a semiconductor device layer, the semiconductor device layer including a plurality of diffusion regions, each of the backside power rails at least partially overlapping a respective diffusion region of the plurality of diffusion regions and defining openings which expose portions of the respective diffusion region at the backside of the semiconductor device layer,
wherein a front side interconnection structure is disposed on a front side of the semiconductor device layer, and includes at least one electrical contact.

12. The method of claim 11, further comprising:
performing physical failure analysis (PFA) testing on the semiconductor device layer from the backside of the semiconductor device layer, the performing PFA testing including irradiating the exposed portions of the diffusion regions with radiation by a PFA tester.

13. The method of claim 11, wherein the forming the plurality of backside power rails includes forming each of the backside power rails having a first length extending along a first direction, and the openings having a second length along the first direction that is within a range from a contact poly pitch of transistors in the semiconductor device layer to ten times the contact poly pitch.

14. The method of claim 13, wherein the forming the plurality of backside power rails includes forming each of the backside power rails having a first width extending along a second direction, and the openings having a second width along the second direction that is less than the second length along the first direction.

15. The method of claim 11, wherein the forming the plurality of backside power rails includes forming each of the backside power rails having a length extending along a first direction, and a pitch between adjacent backside power rails of the plurality of backside power rails along a second direction transverse to the first direction being within a range from 50 nm to 100 nm.

16. The method of claim 11, wherein the forming the plurality of backside power rails includes forming each of the backside power rails having a length extending along a first direction, and having a pitch between adjacent openings of at least one of the backside power rails that is within a range from two times a contact poly pitch of transistors in the semiconductor device layer to ten times the contact poly pitch.

17. The method of claim 11, further comprising:
forming a backside power delivery network on the plurality of backside power rails, the plurality of backside power rails disposed between the backside power delivery network and the backside of the semiconductor device layer.

18. The method of claim 17, wherein the forming the backside power delivery network includes forming a plurality of power delivery lines having a pitch between adjacent ones of the plurality of power delivery lines along a first direction that is within a range from two times a contact poly pitch of transistors in the semiconductor device layer to twenty-four times the contact poly pitch.

19. A method, comprising:
forming a front side interconnection structure on a first side of a semiconductor device layer, the forming the front side interconnection structure including forming at least one electrical contact;
forming a backside interconnection structure on a second side of the semiconductor device layer that is opposite the first side, the forming the backside interconnection structure including:
forming a plurality of backside power rails, each of the backside power rails at least partially overlapping a respective diffusion region of a plurality of diffusion regions of the semiconductor device layer and defining openings which expose portions of the respective diffusion region at the second side of the semiconductor device layer; and
forming a backside power delivery network on the plurality of backside power rails, the plurality of backside power rails disposed between the backside power delivery network and the second side of the semiconductor device layer.

20. The method of claim 19, wherein the forming the backside interconnection structure further includes:
forming a plurality of backside vias extending between the semiconductor device layer and the plurality of backside power rails.

* * * * *